(12) United States Patent
Lee et al.

(10) Patent No.: US 7,361,547 B2
(45) Date of Patent: Apr. 22, 2008

(54) METHOD FOR FORMING A CAPACITOR FOR USE IN A SEMICONDUCTOR DEVICE

(75) Inventors: Kwang Wook Lee, Sungnam-si (KR); In-Seak Hwang, Suwon-si (KR); Yong-Sun Ko, Suwon-si (KR); Ki-Hyun Hwang, Sungnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/024,981

(22) Filed: Dec. 30, 2004

(65) Prior Publication Data

US 2005/0170603 A1 Aug. 4, 2005

(30) Foreign Application Priority Data

Jan. 2, 2004 (KR) ............... 10-2004-0000076

(51) Int. Cl.
*H01L 21/8242* (2006.01)

(52) U.S. Cl. ............... 438/253; 438/396; 257/E27.086

(58) Field of Classification Search ........ 438/393–399, 438/243–256; 258/E27.086
See application file for complete search history.

(56) References Cited

U.S. PATENT DOCUMENTS

| 6,077,742 | A | * | 6/2000 | Chen et al. ................. 438/255 |
| 6,156,608 | A | | 12/2000 | Chen .......................... 438/253 |
| 6,184,077 | B1 | * | 2/2001 | Shin et al. ................. 438/241 |
| 6,238,968 | B1 | * | 5/2001 | Yu et al. ..................... 438/253 |
| 6,528,368 | B1 | | 3/2003 | Park .......................... 438/253 |
| 6,852,781 | B2 | * | 2/2005 | Savu et al. ................. 524/168 |
| 2001/0031556 | A1 | | 10/2001 | Pas ............................ 438/689 |
| 2001/0039116 | A1 | | 11/2001 | Takeshima et al. ......... 438/689 |
| 2003/0071299 | A1 | * | 4/2003 | Ohno ......................... 257/306 |
| 2003/0178728 | A1 | * | 9/2003 | Park et al. .................. 257/758 |
| 2004/0137680 | A1 | * | 7/2004 | Matsumura ................ 438/255 |

* cited by examiner

*Primary Examiner*—H. Jey Tsai
(74) *Attorney, Agent, or Firm*—Lee and Morse, P.C.

(57) ABSTRACT

A method for forming a capacitor for use in a semiconductor device having electrode plugs surrounded by an insulating film and connected to underlying contact pads, includes sequentially forming an etch stop film and a mold oxide film on the insulating film and the electrode plugs, forming recesses in portions of the mold oxide film and the etching stopper film, the recesses exposing the electrode plugs, forming storage node electrodes in the recesses, filling the recesses in which the storage node electrodes are formed with an artificial oxide film, planarizing the storage node electrodes and the artificial oxide film so that the storage node electrodes are separated from one another, and selectively removing the mold oxide film and the artificial oxide film using a diluted hydrofluoric acid solution containing substantially no ammonium bifluoride.

16 Claims, 7 Drawing Sheets

Poly attack

FIG.9b

METHOD FOR FORMING A CAPACITOR FOR USE IN A SEMICONDUCTOR DEVICE

BACKGROUND OF THE INVENTION

1. Field of the Invention

The present invention relates to method for forming a semiconductor device. More particularly, the present invention relates to a method for forming a capacitor having reduced defects arising during fabrication of the capacitor for the semiconductor device.

2. Description of the Related Art

Recently, as semiconductor users require semiconductor devices having low power use, high storage capacity and high speed features, semiconductor manufacturers have increasingly investigated highly integrated, high-speed semiconductor devices. In particular, a dynamic random access memory (DRAM), which has a free data input/output capability and a large storage capacity, is widely used as a semiconductor memory cell.

Generally, a DRAM is a collection of unit cells, each cell having one MOS transistor and one storage capacitor. The capacitance of a capacitor depends on a thickness of a dielectric film, a dielectric constant, and a contact area between an upper electrode and a lower electrode. As increased integration reduces the size of a semiconductor chip, the size of the capacitor is also reduced. The reduction in capacitor size correspondingly reduces the capacitance and, hence, the storage capacity of a capacitor. Thus, a capacitor having sufficient storage capacity to ensure operation of the semiconductor memory device, even as integration of the semiconductor memory increased, is needed.

One solution involves a capacitor having a one cylinder storage (OCS) structure, in which a total effective area of the capacitor can be increased by increasing a vertical area while reducing a horizontal area occupied by the capacitor in the semiconductor memory cell, resulting in increased storage capacitance.

However, a storage node electrode using a capacitor having the aforementioned OCS structure has a relatively high aspect ratio, i.e., its height is much greater than its width. Such high aspect ratio storage node electrodes tend to lean or collapse. In particular, multi-bit failure occurs when the storage node electrodes are slanted or damaged easily due to surface tension during removal of a mold oxide film formed between the storage node electrodes. Twin-bit failure also occurs when upper portions of neighboring storage node electrodes are in contact with each other. Further, when a buffered oxide etchant (BOE) containing ammonium fluoride ($NH_4F$) is used to remove the mold oxide film, $NH_4F$ reacts with water to create $OH^-$ ions, which cause defects in the storage node electrodes of a polysilicon material, resulting in property degradation and defects in the semiconductor device. If the storage node electrodes are crystallized to prevent the storage node electrode from leaning or collapsing, or if the storage node electrodes are annealed to form a hemi-spherical grain (HSG) film on the storage node electrodes, defects in the storage node electrodes are further increased during removal of the mold oxide film.

Further, a BOE has a slow etch rate for a doped oxide film. Therefore, when the BOE is used to remove a mold oxide film, a removing process time increases, thereby degrading semiconductor fabrication yield.

SUMMARY OF THE INVENTION

The present invention is therefore directed to a method for forming a capacitor for use in a semiconductor device, which substantially overcomes one or more of the problems due to the limitations and disadvantages of the related art It is a feature of an embodiment of the present invention to provide a method for forming a capacitor for use in a semiconductor device, which reduces or minimizes defects in storage node electrodes by using a diluted (DHF) solution having an adjusted dilution ratio, rather than ammonium fluoride ($NH_4F$), to remove a mold oxide film during capacitor formation.

It is another feature of an embodiment of the present invention to provide a method for forming a capacitor for use in a semiconductor device, which reduces or minimizes defects in storage node electrodes by using a DHF solution having an adjusted dilution ratio and an added surface active agent to remove a mold oxide film during capacitor formation.

It is yet another feature of an embodiment of the present invention to provide a method for forming a capacitor for use in a semiconductor device, which reduces or minimizes property degradation and defects of the semiconductor device by allowing for forming a capacitor in which defects in storage node electrodes are eliminated or reduced.

It is still another feature of an embodiment of the present invention to provide a method for forming a capacitor for use in a semiconductor device, which is capable of reducing a process time to remove a mold oxide film and securing a process margin by using a DHF solution having an adjusted dilution ratio, rather than a buffered oxide etchant (BOE) containing $NH_4F$, to remove a mold oxide film during capacitor formation.

At least one of the above and other features and advantages of the present invention may be realized by a method for forming a capacitor for use in a semiconductor device having electrode plugs, the electrode plugs being surrounded by an insulating film and connected to underlying contact pads, the method including sequentially providing an etch stop film and a mold oxide film on the insulating film and the electrode plugs, forming recesses in portions of the mold oxide film and the etch stop film, the recesses exposing the electrode plugs, forming storage node electrodes in the recesses, filling the recesses in which the storage node electrodes are formed with an artificial oxide film, planarizing the storage node electrodes and the artificial oxide film so that the storage node electrodes are separated from one another, and selectively removing the mold and artificial oxide films using a solution having a higher etch rate for the mold and artificial oxide films than for the etch stop film.

The method may include adjusting the solution increase an etch selectivity ratio between the mold and artificial oxide films and the etch stop film. The adjusting may include altering the concentration of an etchant in the solution and/or adding a surface agent to the solution.

The solution may be a diluted hydrofluoric acid (DHF) solution containing substantially no ammonium bifluoride. The DHF solution may be obtained by mixing hydrofluoric acid (HF) and deionized water. The DHF solution may have an HF concentration of about 4.5 wt % to 30 wt %. The DHF solution may further include a surface active agent, e.g., potassium hydrogen phthalate. Removal of the mold and artificial oxide films may include immersing a wafer the semiconductor device thereon in the DHF solution, cleaning the wafer, and drying the wafer.

The mold oxide film may be formed of any material selected from an oxide film group consisting of tetra ethyl ortho silicate (TEOS), borophosphosilicate glass (BPSG), phosphosilicate glass (PSG), or a multi-layered film including two or more materials selected from the oxide film group. The mold oxide film may be provided using a chemical vapor deposition (CVD), a low pressure chemical vapor deposition (LPCVD) or a plasma enhanced chemical vapor deposition (PECVD).

The etch stop film may be a silicon nitride and the artificial oxide film may be an undoped silicate glass (USG). The method may further include sequentially forming a dielectric film on the storage node electrodes and plate electrodes opposing the storage node electrodes, after removing the mold oxide film and the artificial oxide film.

The method may include performing an annealing process to crystallize the storage node electrodes after forming the storage node electrodes in the recesses. The method may include performing an annealing process on surfaces of the storage node electrodes to form a hemi-spherical grain (HSG) film after forming the storage node electrodes.

BRIEF DESCRIPTION OF THE DRAWINGS

The above and other features and advantages of the present invention will become more apparent to those of ordinary skill in the art by describing in detail preferred exemplary embodiments thereof with reference to the attached drawings in which.

DETAILED DESCRIPTION OF THE INVENTION

Korean Patent Application No. 2004-76, filed on Jan. 2, 2004 in the Korean Intellectual Property Office, and entitled: "Method for Forming Capacitor for Use in Semiconductor Device," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 to 6 illustrate cross-sectional views of sequential stages in a method for forming a capacitor according to exemplary embodiments of the present invention. This method will be discussed in detail with reference to FIGS. 1 to 6.

Figure 1:
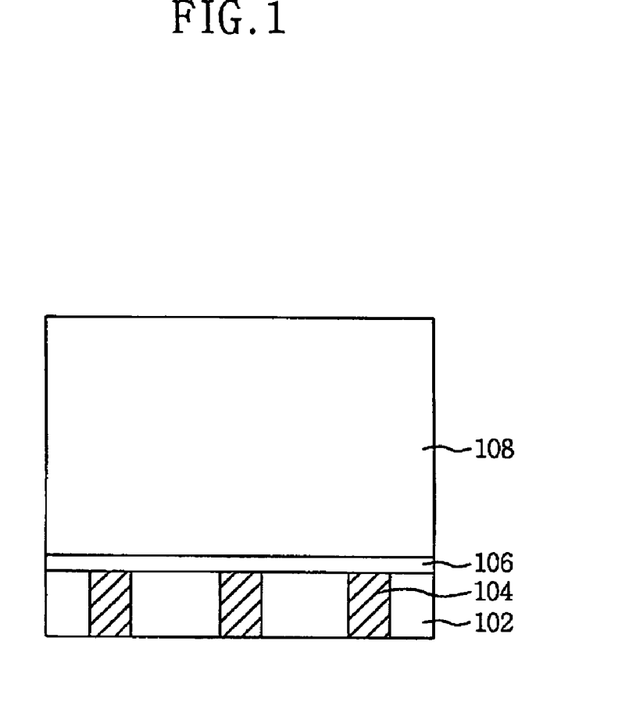
FIGS. 1 to 6 illustrate cross-sectional views of sequential stages of a method for forming a capacitor according to exemplary embodiments of the present invention.

Referring to FIG. 1, an interlayer insulating film 102 is formed on a semiconductor substrate having transistors and storage node contact pads formed thereon. The interlayer insulating film 102 is subjected to photolithographic and etching processes, so that storage node contact holes connected to the storage node contact pads are formed. Subsequently, a conductive material, e.g., a polysilicon material, fills the storage node contact holes. Thereafter, the conductive material is subjected to a planarization process, such as a chemical mechanical polishing (CMP), an etch back, or other suitable process, until the interlayer insulating film 102 is exposed, thereby forming storage node contact plugs 104 that are electrically connected to the storage node contact pads. Subsequently, an etch stop film 106 is formed on the entire surface, and then a mold oxide film 108, formed to a height corresponding to that of a capacitor to be formed, is provided on the etch stop film 106. The etch stop film 106 may be formed of a nitride film material, e.g., silicon nitride, having a removal rate relatively lower than that of the mold oxide film 108. The mold oxide film 108 may be formed of any one selected from an oxide film group consisting of materials having excellent step coverage, such as tetra ethyl ortho silicate (TEOS), borophosphosilicate glass (BPSG), phosphosilicate glass (PSG), or other suitable material. Alternatively, the mold oxide film 108 may be formed of a multi-layered film including two or more materials selected from the oxide film group. The mold oxide film 108 may be formed using a chemical vapor deposition (CVD), a low pressure chemical vapor deposition (LPCVD), a plasma enhanced chemical vapor deposition (PECVD), or other suitable process.

Figure 2:
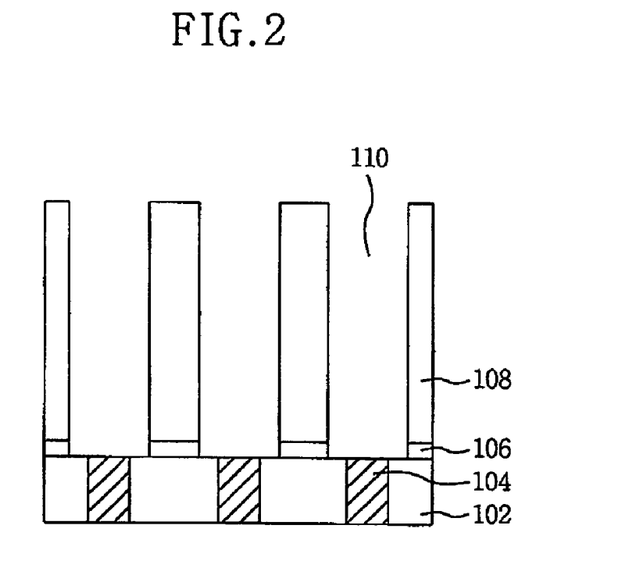

Referring to FIG. 2, a photoresist pattern, which exposes a portion in which storage node electrodes will be formed, is formed on the mold oxide film 108. Then, the mold oxide film 108 is etched using the photoresist pattern as an etching mask, until the etch stop film 106 is exposed. The exposed etch stop film 106 is removed, thereby forming recesses 110 exposing portions of the storage node contact plugs 104. The recesses 110 are etched so that the mold oxide film 108 has a vertical shape, thereby increasing a size of a base of storage node electrodes that will be formed in a subsequent process. The increase of the base size of the storage node electrodes allows the contact resistance with the storage node contact plugs 104 to be reduced, and the lean or tilt of the storage node electrodes having a high aspect ratio to be minimized.

Figure 3:
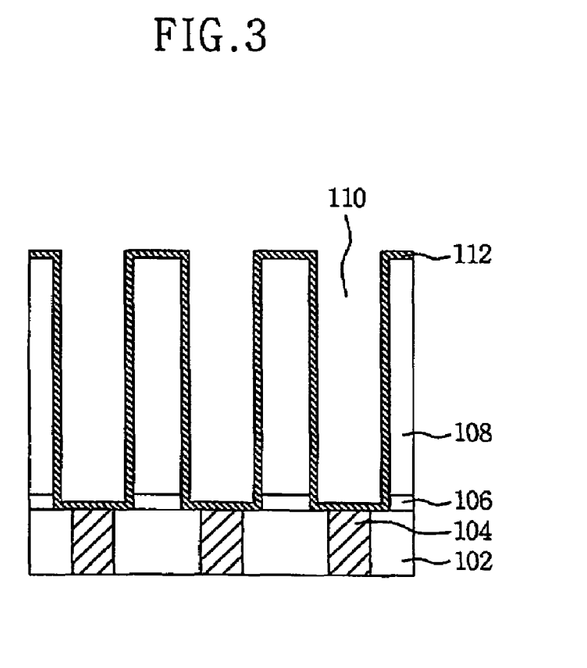

Referring to FIG. 3, after the photoresist pattern is removed, e.g., by an ashing or stripping process, the entire surface of the semiconductor substrate, including inner portions of the recesses 110, is subjected to a deposition process, such as a CVD process or other suitable process, to thereby forming storage node electrodes 112, e.g., of a polysilicon material. The storage node electrodes 112 have a thickness in accordance with a desired capacitance of the capacitor, a tilt of the electrode, and other parameters of interest. The storage node electrodes 112 may be formed to a thickness of about 80 nm to 120 nm.

Figure 4A:
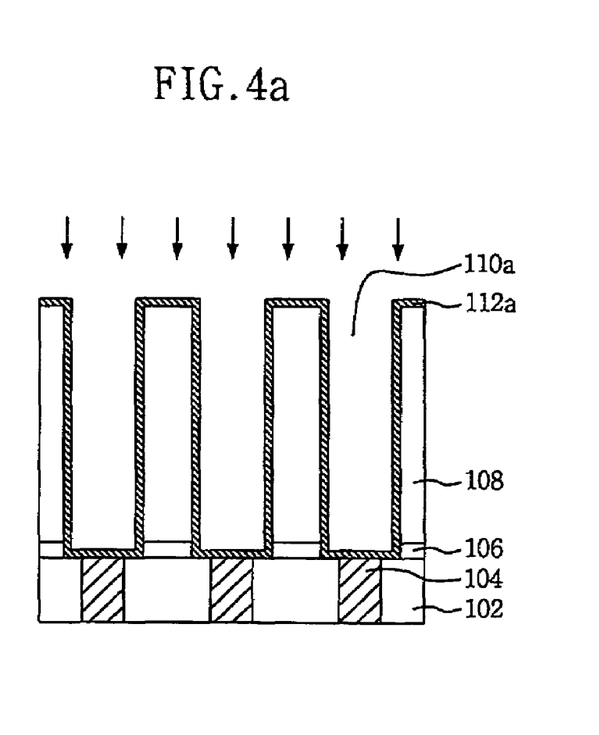

As shown in FIG. 4a, after the storage node electrodes 112 are formed, an annealing process may be conducted to crystallize the storage node electrodes, thereby forming storage node electrodes 112a. The annealing process may be conducted after the formation of the storage node electrodes to crystallize the storage node electrodes of a polysilicon material, such that stress applied to the storage node electrodes is minimized. Therefore, it is possible to prevent tilt or collapse of storage node electrodes having a high aspect ratio, thus allowing the height of the capacitor to be further increased, thereby increasing the capacitance of the capacitor.

Figure 4B:
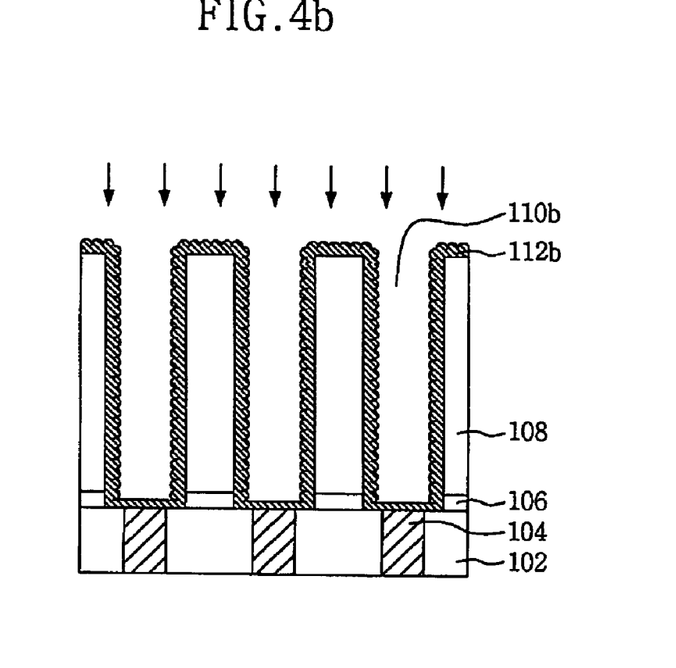

As shown in FIG. 4b, after the storage node electrodes 112a are formed, an annealing process may be conducted to form a HSG film on the storage node electrodes. The HSG film is formed in the form of a hemisphere having a rough surface due to thermal movement of a nucleus by causing nucleus creation on the surface of the storage node electrode 112a by injecting a silicon type gas having strong surface reaction, e.g., a $Si_2H_6$ gas, or the like, into a HSG film creation process chamber maintained at a high temperature, and then annealing the surface of the storage node electrodes 112a. After being formed, the HSG film is converted to polysilicon by diffusing phosphorus. Accordingly, resultant storage node electrodes 112b will have a surface area than is about two to three times greater than that of a flat surface, and the capacitance of the capacitor can be increased due to the increased surface area.

Figure 5A:
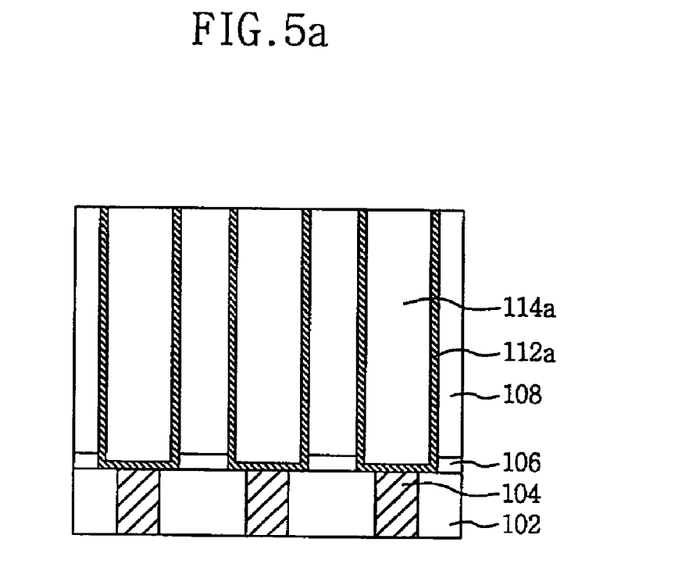

Referring to FIG. 5a, after the annealing process is conducted to crystallize the storage node electrodes 112a, an artificial oxide film 114a is formed to fill in the recesses 110a. Subsequently, upper surfaces of the artificial oxide film 114a and the storage node electrodes 112a are removed by a planarization process, e.g., a chemical mechanical polishing (CMP), an etch-back, or other appropriate process, so that the storage node electrodes 112a are separated from one another. The artificial oxide film 114a may be formed of an oxide film, e.g., an undoped silicate glass (USG).

Figure 5B:
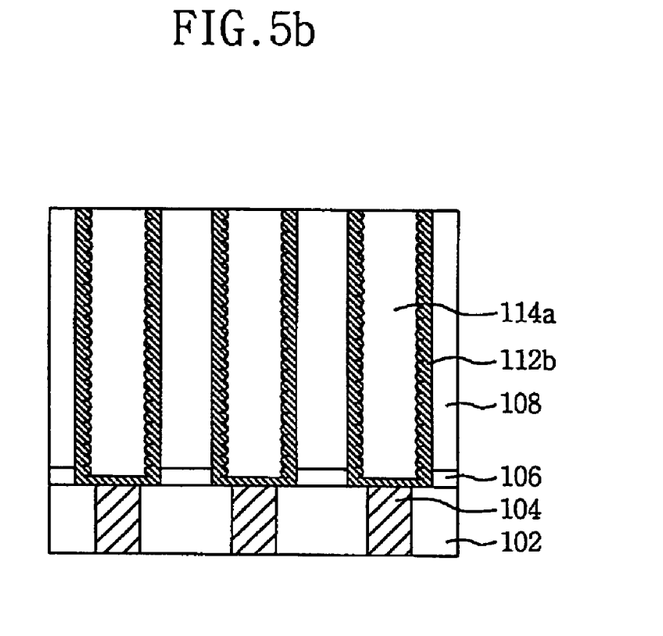

Referring to FIG. 5b, when the annealing process has been conducted to form the HSG film on the storage node electrodes, as shown in FIG. 4b, the artificial oxide film 114a is similarly used to fill the recesses 110b. Subsequently, upper surfaces of the artificial oxide film 114a and the storage node electrodes 112b are removed by a planarization process, e.g., a chemical mechanical polishing (CMP), an etch-back, or other appropriate process, such that the storage node electrodes 112b are separated from one another.

Figure 6A:
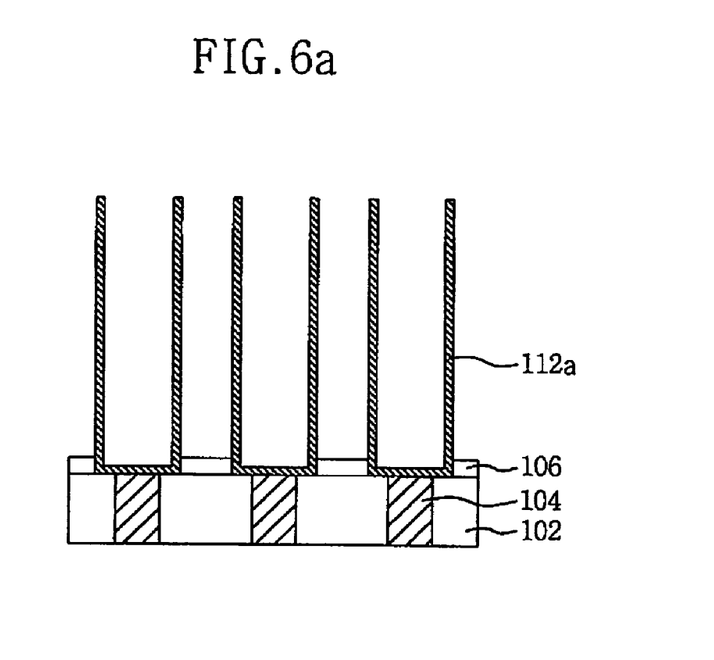

Referring to FIG. 6a, after the storage node electrodes 112a are separated from one another, the mold oxide film 108 and the artificial oxide film 114a are selectively removed, e.g., using a diluted hydrofluoric acid (DHF) solution. In accordance with an embodiment of the present invention, the removal of the mold oxide film 108 and the artificial oxide film 114a may be conducted using DHF solution rather than conventional ammonium fluoride ($NH_4F$) that causes defects on the surface of the storage node electrodes and has a low etch rate for the doped oxide film. The removal of the mold oxide film 108 and artificial oxide film 114a may be realized by a dipping process, i.e., immersing a wafer having the storage nodes thereon into the DHF solution adjusted to have a certain concentration, and then cleaning and drying the wafer, e.g., with deionized water.

Figure 6B:
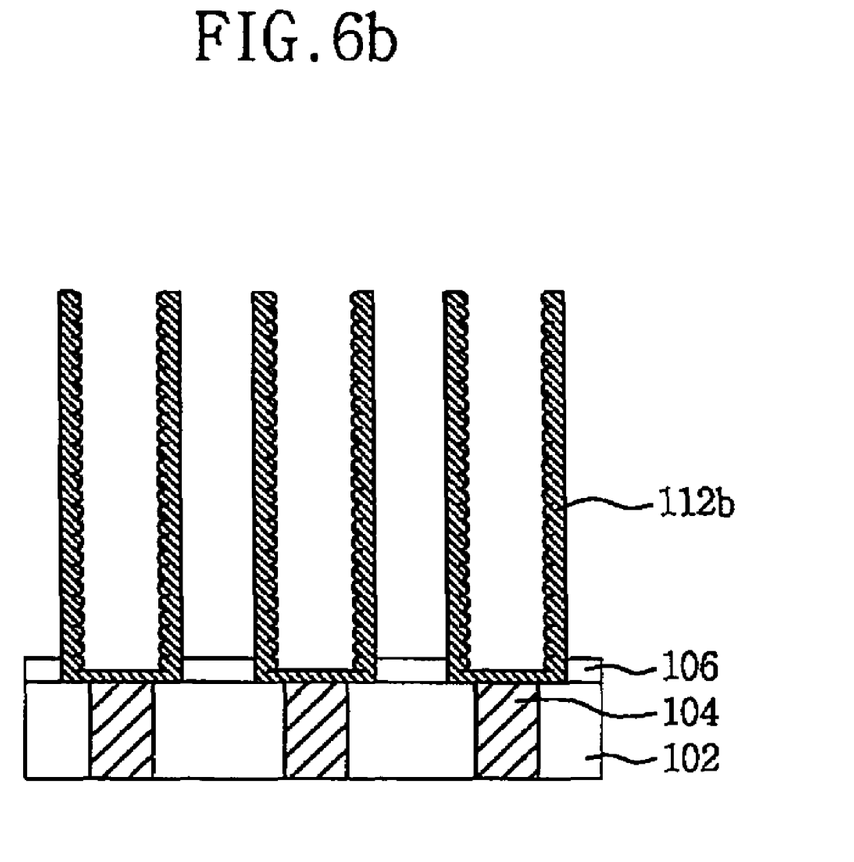

Referring to FIG. 6b, after the storage node electrodes 112b are separated from one another, the mold oxide film 108 and the artificial oxide film 114a are selectively removed using the DHF solution, as well.

Thereafter, although not shown in FIGS. 6a and 6b, a dielectric film is formed on the storage node electrodes 112a and 112b, and plate electrodes opposing the storage node electrodes are formed, thereby forming a capacitor.

Because DHF has an etch rate for an oxide film that is less than that for a nitride film, it is necessary to adjust the DHF solution to a proper concentration to prevent the etch stop film 106 formed beneath the mold oxide film 108 from being etched when only using DHF to remove the mold oxide film 108 and the artificial oxide film 114a. Accordingly, the dilution ratio of the DHF solution used in the method for forming a capacitor according to an exemplary embodiment of the present invention is adjusted so that the etch selectivity of the oxide film to the nitride film is maximized, while also increasing removal the mold oxide film 108 and the artificial oxide film 114a,b. Specifically, the DHF solution used in the method for forming a capacitor according to an exemplary embodiment of the present invention is obtained by mixing hydrofluoric acid (HF) and deionized water (DIW), adjusted to a optimal concentration of the HF, e.g., about 4.5 wt % to 30 wt %.

Further, a surface active agent may be added to the DHF solution to maximize the etch selectivity ratio of the oxide film to the nitride film. In particular, addition of an appropriate surface active agent to the DHF solution allows the etch rate of the nitride film to be reduced without changing the etch rate of the oxide film, thereby increasing the etch selectivity of the oxide film to the nitride film. An example of such an appropriate surface active agent is potassium hydrogen phthalate.

Figure 7:
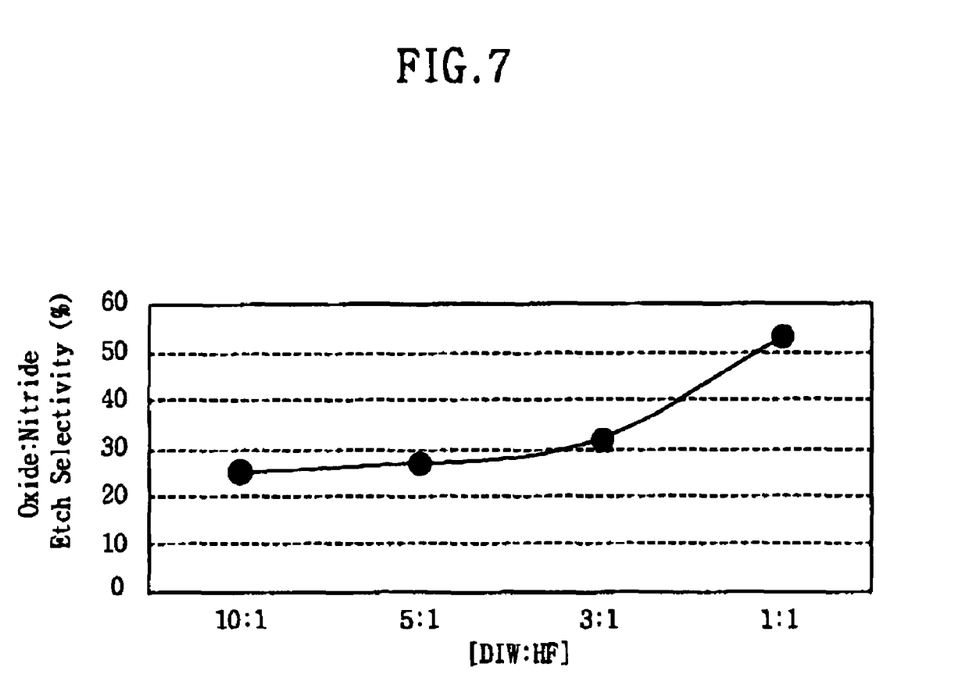
FIG. 7 is a graph illustrating a relationship between a dilution ratio of a dilute hydrofluoric acid (DHF) and an etch selectivity ratio of an oxide film to a nitride film used in a method for forming a capacitor according to an embodiment of the present invention.

FIG. 7 is a graph showing a relationship between a dilution ratio of a DHF solution and an etch selectivity of an oxide film to a nitride film used in a method for forming a capacitor according to an exemplary embodiment of the present invention.

Referring to FIG. 7, the etch selectivity of an oxide film to a nitride film increases with increasing concentration of HF in the DHF solution. Thus, increasing concentration of the HF in the DHF solution minimizes effects on the nitride film, while decreasing a removal time of the oxide films, thereby reducing a time process window. Accordingly, the concentration of HF in the DHF solution can be adjusted to be about 4.5 wt % to 30 wt %.

Figure 8:
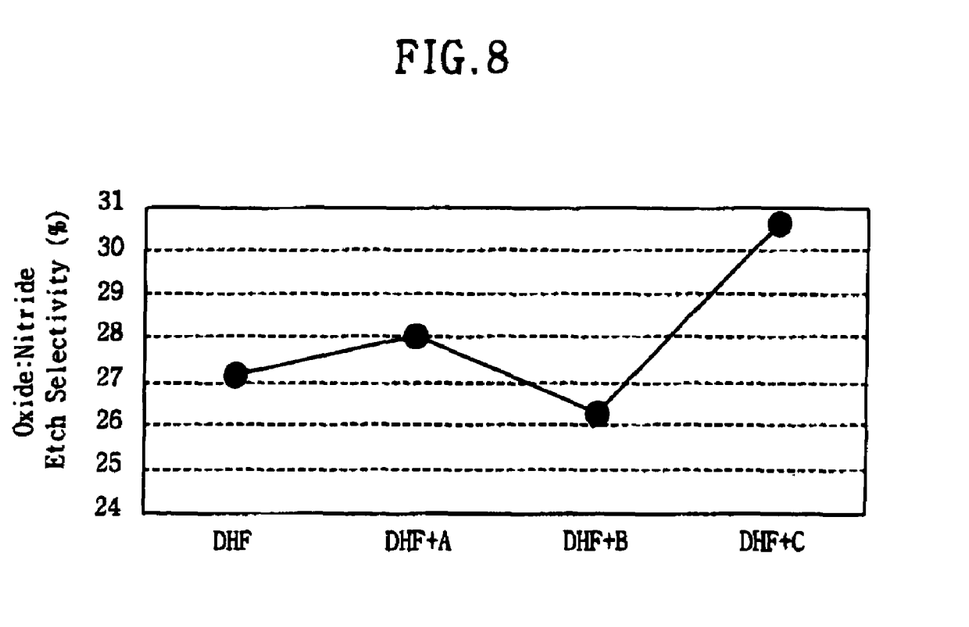
FIG. 8 is a graph illustrating a relationship of an etch selectivity ratio of an oxide film to a nitride film when a surface active agent is added to a DHF used in a method for forming a capacitor according to an embodiment of the present invention.

FIG. 8 is a graph showing a relationship between an etch selectivity of an oxide film to a nitride film when a variety of surface active agents A, B or C is added to a DHF solution used in a method for forming a capacitor according to an exemplary embodiment of the present invention.

Referring to FIG. 8, the addition of surface active agents to the DHF solution alters the etch selectivity of an oxide film to a nitride film compared with that for the DHF solution alone. As can be seen therein, addition of the surface active agent A only slightly increases the etch selectivity, while addition of the surface active agent B decreases the etch selectivity. However, when the surface active agent C, e.g., potassium hydrogen phthalate, is added to the DHF (DHF+C), the etch selectivity of an oxide film to a nitride film is increased.

Further, the DHF solution may be adjusted by both altering the HF concentration and by adding an appropriate surface active agent.

Figure 9A:
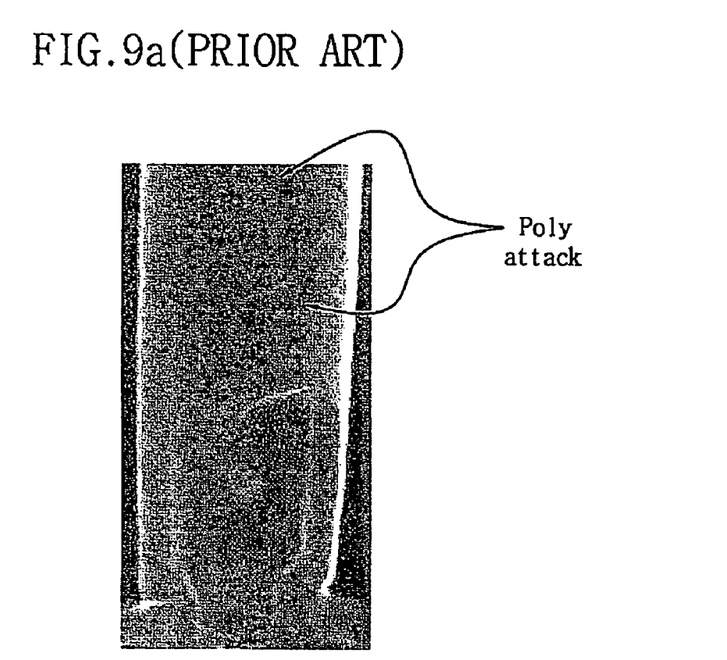
FIG. 9a illustrates a cross-sectional view of a capacitor formed using a method for forming a capacitor according to a related art.
Figure 9B:
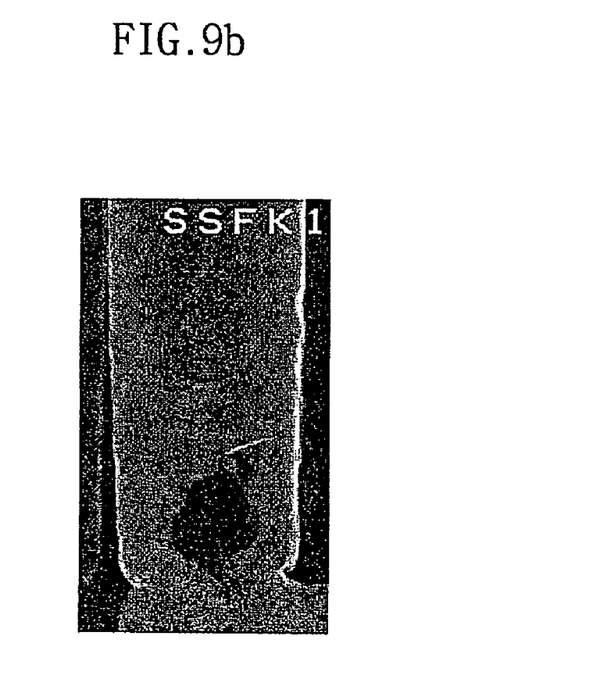
FIG. 9b illustrates a cross-sectional view of a capacitor formed using a method for forming a capacitor according to an embodiment of the present invention.

FIG. 9a illustrates a cross-sectional view of a capacitor formed using a method for forming a capacitor according to a prior art, and FIG. 9b illustrates a cross-sectional view of a capacitor formed using a method for forming a capacitor according to an exemplary embodiment of the present invention. Comparison of FIGS. 9a and 9b is provided below.

First, as shown in FIG. 9a, serious defects occur in storage node electrodes of a polysilicon material when the capacitor is formed by removing the mold oxide film using a buffered oxide etchant (BOE) containing $NH_4F$ according to the prior art. These defects in the storage node electrodes are further increased when the storage node electrodes are annealed to crystallize the storage node electrodes or to form a HSG film on the storage node electrodes to prevent leaning or collapse of the storage node electrodes.

In contrast, as shown in FIG. 9b, there are no defects in the storage node electrodes when the capacitor is formed by removing the mold oxide film using the DHF solution according to an exemplary embodiment of the present invention.

Thus, using the method for forming a capacitor according to an exemplary embodiment of the present invention, a capacitor having reduced or minimized defects in the storage node electrodes may be formed. In particular, the defects are reduced by using a DHF solution having an adjusted dilution ratio, rather than $NH_4F$, to remove a mold oxide film. Further, even when an annealing process is performed on the storage node electrodes to crystallize the storage node electrodes or to form the HSG film on the storage node electrodes so that leaning or collapse of the storage node electrodes is prevented, use of the DHF solution reduces or minimizes defects in the storage node electrodes. The DHF solution used to remove the mold oxide film may have an adjusted dilution ratio and/or an added surface active agent to remove the mold oxide film. Further, use of the DHF solution to remove the mold oxide film may reduce a process time for the removal of the mold oxide film and secure a process margin compared with that when using the BOE containing $NH_4F$.

Further, feature degradation and defects of a semiconductor device may be minimized or reduced by forming a capacitor having a storage node electrode in which defects are removed or reduced in accordance with exemplary embodiments of the present invention.

Exemplary embodiments of the present invention have been disclosed herein, and although specific terms are employed, they are used and are to be interpreted in a generic and descriptive sense only and not for purpose of limitation. For example, in a semiconductor device fabrication process of removing the mold oxide film, the DHF solution used in the exemplary embodiment of the present invention may be used without constraint. Accordingly, it will be understood by those of ordinary skill in the art that various changes in form and details may be made without departing from the spirit and scope of the present invention as set forth in the following claims.

What is claimed is:

1. A method for forming a capacitor for use in a semiconductor device having electrode plugs, the electrode plugs being surrounded by an insulating film and connected to underlying contact pads, the method comprising:

sequentially forming an etch stop film and a mold oxide film on the insulating film and the electrode plugs;

forming recesses in portions of the mold oxide film and the etch stop film, the recesses exposing the electrode plugs, wherein the mold oxide film and etch stop film are vertically aligned after the recesses are formed;

forming storage node electrodes in the recesses;

filling the recesses in which the storage node electrodes are formed with an artificial oxide film;

planarizing the storage node electrodes and the artificial oxide film to expose a planarized surface of the artificial oxide film between adjacent portions of the storage node electrodes and to separate the storage node electrodes from one another; and selectively removing the mold and artificial oxide films using a diluted hydrofluoric acid (DHF) solution having a higher etch rate for the mold and artificial oxide films than for the etch stop film, wherein:

the DHF solution has an HF concentration of about 4.5 wt % to about 30 wt %, and the DHF solution further includes a surface active agent.

2. The method as claimed in claim 1, further comprising adjusting the solution to increase an etch selectivity ratio between the mold and artificial oxide films and the etch stop film.

3. The method as claimed in claim 1, further comprising performing an annealing process to crystallize the storage node electrodes after forming the storage node electrodes in the recesses.

4. The method as claimed in claim 1, wherein the DHF solution is obtained by mixing hydrofluoric acid (HF) and deionized water.

5. The method as claimed in claim 1, wherein the surface active agent is potassium hydrogen phthalate.

6. The method as claimed in claim 1, wherein removing the mold oxide film and the artificial oxide film comprises immersing a wafer having the storage node electrodes thereon in the DHF solution, cleaning the wafer, and drying the wafer.

7. The method as claimed in claim 1, wherein forming the mold oxide film comprises using any material selected from an oxide film group consisting of tetra ethyl ortho silicate (TEOS), borophosphosilicate glass (BPSG), phosphosilicate glass (PSG), or using a multi-layered film including two or more materials selected from the oxide film group.

8. The method as claimed in claim 1, wherein forming the mold oxide film comprises using chemical vapor deposition (CVD), low pressure chemical vapor deposition (LPCVD) or plasma enhanced chemical vapor deposition (PECVD).

9. The method as claimed in claim 1, wherein the etch stop film is formed of silicon nitride.

10. The method as claimed in claim 1, wherein the artificial oxide film is an undoped silicate glass (USG).

11. The method as claimed in claim 1, further comprising sequentially forming a dielectric film on the storage node electrodes and plate electrodes opposing the storage node electrodes, after removing the mold oxide film and the artificial oxide film.

12. The method as claimed in claim 1, further comprising performing an annealing process on surfaces of the storage node electrodes to form a hemi-spherical grain (HSG) film after forming the storage node electrodes.

13. The method as claimed in claim 12, wherein the DHF solution is obtained by mixing hydrofluoric acid (HF) and deionized water.

14. The method as claimed in claim 12, wherein removing the mold oxide film and the artificial oxide film comprises immersing a wafer having the storage node electrodes thereon in the DHF solution, cleaning the wafer, and drying the wafer.

15. The method as claimed in claim 12, further comprising sequentially forming a dielectric film on the storage node electrodes and plate electrodes opposing the storage node electrodes, after removing the mold oxide film and the artificial oxide film.

16. The method as claimed in claim 1, wherein the DHF solution contains substantially no ammonium fluoride.

* * * * *